(12) United States Patent
Kobayashi

(10) Patent No.: US 7,701,239 B2
(45) Date of Patent: Apr. 20, 2010

(54) DETECTION CIRCUIT

(75) Inventor: Kazuyuki Kobayashi, Midori (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 87 days.

(21) Appl. No.: 12/172,047

(22) Filed: Jul. 11, 2008

(65) Prior Publication Data

US 2009/0015240 A1 Jan. 15, 2009

(30) Foreign Application Priority Data

Jul. 12, 2007 (JP) ............................. 2007-183488

(51) Int. Cl.
*G01R 31/02* (2006.01)
(52) U.S. Cl. .................. 324/763; 324/76.41; 324/520
(58) Field of Classification Search .............. 324/76.41, 324/76.52, 76.77, 537, 606, 656, 665, 685, 324/679, 763, 672; 257/763, 679, 922
See application file for complete search history.

(56) References Cited

U.S. PATENT DOCUMENTS 5,282,685 A * 2/1994 Koegler ..................... 374/172

2008/0238529 A1 * 10/2008 Kumagai ..................... 327/512

FOREIGN PATENT DOCUMENTS

JP 2004-163251 6/2004

* cited by examiner

*Primary Examiner*—Minh N Tang
*Assistant Examiner*—Trung Q Nguyen
(74) *Attorney, Agent, or Firm*—SoCal IP Law Group LLP; Steven C. Sereboff; John E. Gunther

(57) ABSTRACT

A detection circuit includes: a control signal updating circuit configured to update a digital control signal for controlling drive of a sensor based on a clock having a predetermined frequency; a digital to analog converter configured to convert the digital control signal output from the control signal updating circuit to an analog control signal for driving the sensor; a comparator configured to compare a voltage level of a detection signal from the sensor which changes depending on the analog control signal with a reference voltage having a predetermined voltage level to output a comparison result signal; and a counter configured to count to measure a time period depending on the detection signal based on the comparison result signal output from the comparator and a clock having a predetermined frequency.

8 Claims, 8 Drawing Sheets

DETECTION CIRCUIT

CROSS-REFERENCE TO RELATED APPLICATION

This application claims the benefit of priority to Japanese Patent Application No. 2007-183488, filed Jul. 12, 2007, of which full contents are incorporated herein by reference.

BACKGROUND OF THE INVENTION

1. Field of the Invention

The present invention relates to a detection circuit.

2. Description of the Related Art

When a digital circuit is used for processing based on magnetic force, acceleration, temperature and so on, it is common to use a detection circuit in which a signal having a minute level from a sensor such as a magnetic sensor, an acceleration sensor, or a temperature sensor is amplified by a differential amplifier, and then the amplified signal is converted to a digital signal by an analog to digital converter. Reference is made to Japanese Patent Application Publication No. 2004-163251.

In order to improve detection accuracy of such a detection circuit having an AD converter, the AD converter with high accuracy is required, resulting in increased complexity in terms of circuit configuration.

SUMMARY OF THE INVENTION

A detection circuit according to an aspect of the present invention, includes: a control signal updating circuit configured to update a digital control signal for controlling drive of a sensor based on a clock having a predetermined frequency; a digital to analog converter configured to convert the digital control signal output from the control signal updating circuit to an analog control signal for driving the sensor; a comparator configured to compare a voltage level of a detection signal from the sensor which changes depending on the analog control signal with a reference voltage having a predetermined voltage level to output a comparison result signal; and a counter configured to count to measure a time period depending on the detection signal based on the comparison result signal output from the comparator and a clock having a predetermined frequency.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Magnetic Detection Circuit

Figure 1:
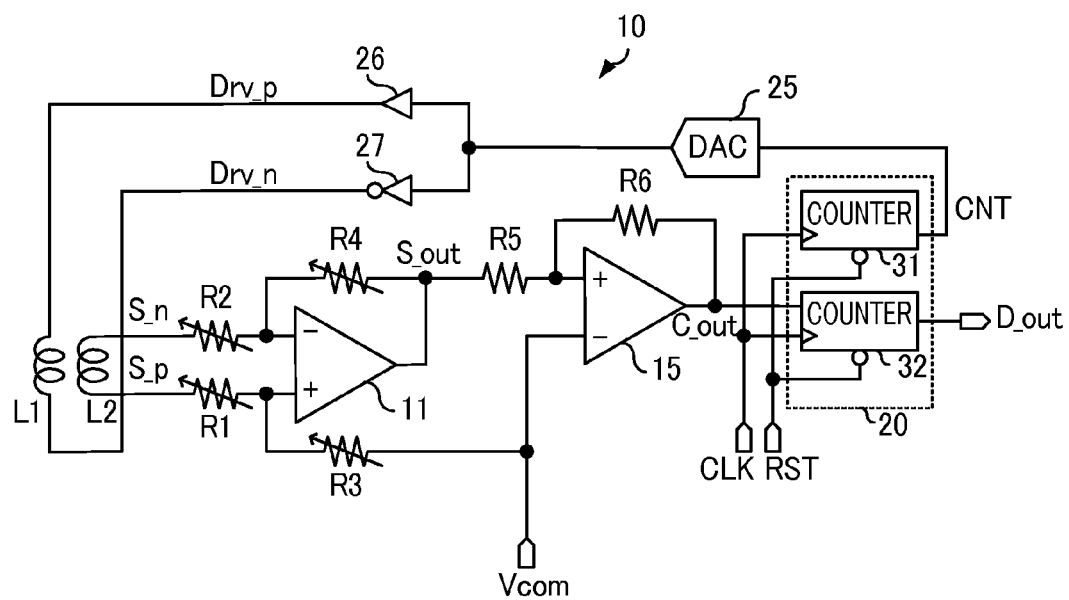
FIG. 1 is a diagram showing an example of a configuration for a magnetic detection circuit in accordance with an embodiment of the present invention.

FIG. 1 is a diagram showing an example of a configuration for a magnetic detection circuit in accordance with an embodiment of the present invention. The magnetic detection circuit 10 includes coils L1 and L2, an operational amplifier 11, a comparator 15, resistors R1 to R6, a digital circuit 20, a digital to analog converter (DAC) 25, a buffer circuit 26, and an inverting buffer circuit 27.

The coils L1 and L2 constitute a magnetic sensor with the coil L1 acting as an excitation coil and the coil L2 acting as a detection coil. When the voltage applied across the coil L1 is changed to excite the coil L1, detection signals S_p and S_n having a minute level and modulated by the magnetic field occur across the coil L2.

The operational amplifier 11 and the resistors R1 to R4 constitute a differential amplifier. The detection signal S_p output from one end of the coil L2 via the resistor R1 is input to a positive input terminal of the operational amplifier 11. The detection signal S_n output from the other end of the coil L2 via the resistor R2 is input to a negative input terminal of the operational amplifier 11. In addition, a reference voltage $V_{com}$ is applied to the positive input terminal of the operational amplifier 11 via the resistor R3. From an output terminal of the operational amplifier 11, a detection signal S_out is output which is produced by amplifying the difference between the detection signals S_p and S_n having minute level with respect to the reference voltage $V_{com}$. Note that the resistors R1 to R4 are variable resistors, therefore, gain of the differential amplifier can be varied by changing resistance value with the help of controllers such as a microcomputer.

The comparator 15 and the resistors R5 and R6 constitute a hysteresis comparator. The detection signal S_out is input to a positive input terminal of the comparator 15 via the resistor R5. The reference voltage $V_{com}$ serving as a reference for comparison is applied to a negative input terminal of the comparator 15. In addition, in the present embodiment, let $\Delta Vhys$ be taken to represent a hysteresis determined by the resistors R5 and R6. That is, when an output signal C_out of the comparator 15 is in low state, if the voltage level of the detection signal S_out becomes larger than $V_{com}+\Delta Vhys$, then the output signal C_out will change to high level. On the other hand, when the output signal C_out of the comparator 15 is in high state, if the voltage level of the detection signal S_out becomes smaller than $V_{com}-\Delta Vhys$, then the output signal C_out will change to low level.

The digital circuit 20 includes counters 31 and 32. The counter 31 (control signal updating circuit) updates a count value CNT (digital control signal) based on a clock CLK with a predetermined frequency. Note that the counter 31 updates the count value CNT such that the count value CNT changes like a triangle wave. For example, if the counter 31 has eight bits, the counter 31 first counts down from 255 to 0, then counts up from 0 to 255. In addition, while a reset signal RST is low level, the counter 31 does not perform counting operation, and thus the count value CNT is maintained at an initial value.

The counter 32 measures a time period in which the output signal C_out of the comparator 15 is low level based on the clock CLK, and outputs the measured time period as a digital signal D_out depending on the detection single S_out. On the other hand, while a reset signal RST is low level, the counter 32 does not perform counting operation, and thus the digital signal D_out is maintained at an initial value.

Note that, in the present embodiment, while it is described that both of the counters 31 and 32 count based on the same clock CLK, they may count based on different clocks.

The DAC 25 converts the count value CNT output from the counter 31 to an analog signal and outputs the analog signal.

The buffer 26 and the inverting buffer 27 constitute a drive circuit for the coil L1, and outputs driving signals Drv_p and Drv_n having levels depending on the analog signal output from the DAC 25 across the coil L1. Note that the driving signal Drv_n is a signal obtained by inverting the driving signal Drv_p with respect to the reference voltage $V_{com}$.

Figure 2:
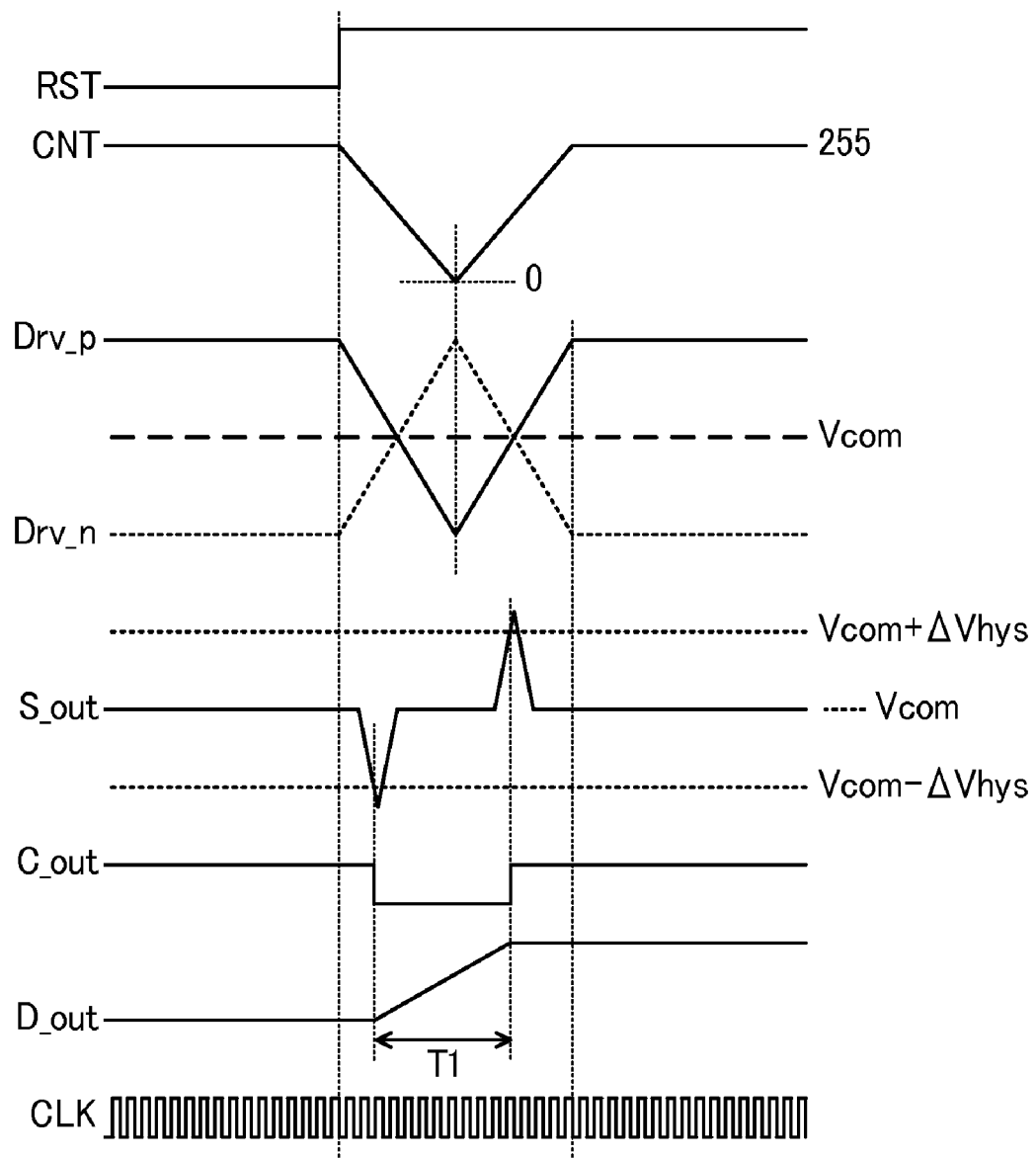
FIG. 2 is a diagram showing an example of an operation of the magnetic detection circuit.

FIG. 2 is a diagram showing an example of an operation of the magnetic detection circuit 10. Here, the counters 31 and 32 have eight bits, the count value CNT to be updated by the counter 31 is set to an initial value of 255, and the digital signal D_out to be updated by the counter 32 is set to an initial value of 0.

When the reset signal RST changes to high level, the counter 31 starts counting down the count value CNT from 255 based on the clock CLK. When the count value CNT reaches to 0, then the counter 31 starts counting up to 255. In this way, the count value CNT changes like a triangle wave. Then, along with the count value CNT, the driving signal Drv_p also changes like a triangle wave. The driving signal Drv_n will be a signal obtained by inverting the driving signal Drv_p with respect to the reference voltage $V_{com}$.

Inputting these driving signals Drv_p and Drv_n across the coil L1 causes the detection signals S_p and S_n which are modulated by magnetic field and have minute level to be occurred across the coil L2. Then, the detection signal S_out obtained by amplifying the difference between the detection signals S_p and S_n having minute level will changes such that first it goes downwardly and then upwardly so as to form two triangles pointing opposite directions with the center of distance between these two triangles being the reference voltage $V_{com}$, as shown in FIG. 2. Therefore, the interval between two triangle-shaped waves appeared on the detection signal S_out will change depending on the magnetic field.

The output signal C_out of the comparator 15 will change to low level when the voltage level of the detection signal S_out becomes lower than $V_{com}-\Delta V hys$, and will change to high level when the voltage level of the detection signal S_out becomes higher than $V_{com}+\Delta V hys$. That is, the time period T1 in which the output signal C_out of the comparator 15 is low level indicates the interval between two triangle-shaped waves shown in the detection signal S_out. While the output signal C_out of the comparator 15 is low level, the counter 32 counts up based on the clock CLK to measure the time period T1, and outputs the measured time period T1 as the digital signal D_out which indicates the detection result of the magnetic force.

In this way, in the magnetic detection circuit 10, the driving signals Drv_p and Drv_n to drive the coils L1 and L2 constituting the magnetic sensor are changed based on the clock CLK, the detection signal S_out resulted from the changes in the driving signals Drv_p and Drv_n is compared to the reference voltage $V_{com}$, and based on the clock CLK and the resulting output signal C_out showing the result of the comparison, the time period depending on the detection signal S_out is determined. That is, the magnetic detection circuit 10 can detect magnetic force with simple configuration and with high accuracy without using a high accuracy AD converter. In addition, the magnetic detection circuit 10 can improve the detection speed by improving the rate of the clock CLK without using a high-speed AD converter. Also, the magnetic detection circuit 10 can lower a supply voltage because it can detect the magnetic force by counting operation in the counter 32 instead of using an AD converter.

Acceleration Detection Circuit

Figure 3:
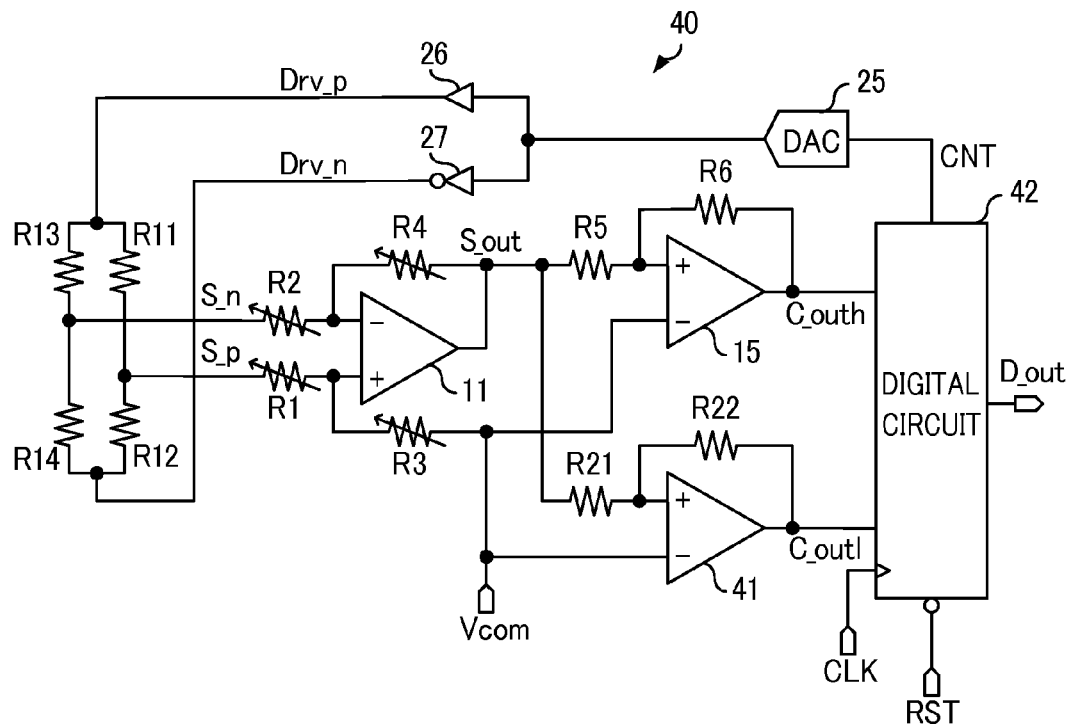
FIG. 3 is a diagram showing an example of a configuration for an acceleration detection circuit in accordance with an embodiment of the present invention.

FIG. 3 is a diagram showing an example of a configuration for an acceleration detection circuit in accordance with an embodiment of the present invention. The acceleration detection circuit 40 includes resistors R11 to R14, a comparator 41, resistors R21 and R22, and a digital circuit 42, in addition to the operational amplifier 11, the comparator 15, the resistors R1 to R6, the DAC 25, the buffer circuit 26, and the inverting buffer circuit 27 provided in the magnetic detection circuit 10.

The resistors R11 to R14 constitute a piezo-resistor acceleration sensor, and the resistance value of the resistors R11 to R14 will change depending on the acceleration, resulting in changes in the detection signals S_p and S_n occurring at the connection points of the resisters R11 and R12, and that of R13 and R14.

As with the comparator 15 and the resistors R5 and R6, the comparator 41 and the resistors R21 and R22 constitute a hysteresis comparator having a hysteresis of $\Delta V hys$ with respect to the reference voltage $V_{com}$. Note that, in the acceleration detection circuit 40, the voltage level of the detection signal S_out output from the operational amplifier 11 prior to starting detection operation is assumed to be the reference voltage $V_{com}$. Also, prior to starting detection operation, it is assumed that the output signal C_outh of the comparator 15 is low level, and the output signal C_outl of the comparator 41 is high level.

As with the digital circuit 20 in the magnetic detection circuit 10, the digital circuit 42 includes a counter, and outputs a count value CNT for driving the piezo-resistor acceleration sensor and a digital signal D_out showing the detection result of the acceleration. Particularly, the digital circuit 42 starts counting up the count value CNT when the reset signal RST becomes high level. Also, the digital circuit 42 measures a time period from when the reset signal RST changes to high level to when the change in the logical level of any one of the output signals C_outh and C_outl of the comparators 15 and 41 occurs, and outputs the signal as the digital signal D_out, to which the information as to whether of the output signals C_outh and C_outl was changed during the measured time period is added.

Figure 4:
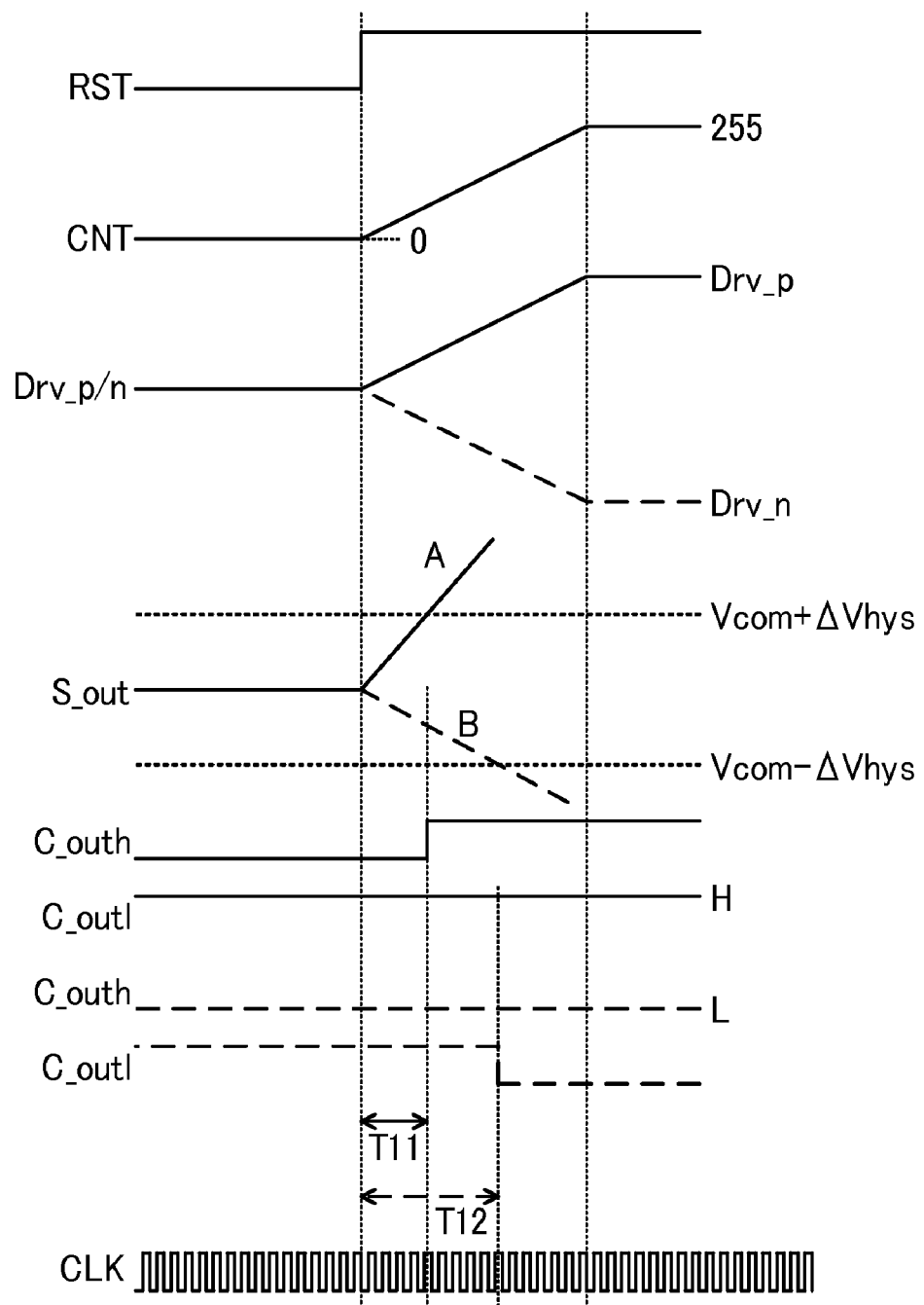
FIG. 4 is a diagram showing an example of an operation of the acceleration detection circuit.

FIG. 4 is a diagram showing an example of an operation of the acceleration detection circuit 40. Here, the counter which updates the count value CNT has eight bits, and the count value CNT is set to an initial value of 0.

When the reset signal RST changes to high level, the digital circuit 42 starts counting up the count value CNT from 0 based on the clock CLK. Along with the count value CNT, the voltage level of the driving signal Drv_p starts increasing from the reference voltage $V_{com}$, and the voltage level of the driving signal Drv_n starts decreasing from the reference voltage $V_{com}$.

Inputting such driving signals Drv_p and Drv_n across a bridge constituted from the resistors R11 to R14 changes the detection signal S_out from the voltage level of the reference voltage $V_{com}$ with a slope depending on the acceleration. For example, in the case where the detection signal S_out changes in dependent on the acceleration as indicated by A in FIG. 4, when the voltage level of the detection signal S_out becomes larger than $V_{com}+\Delta Vhys$, the output signal C_outh will change to high level. In this case, the digital circuit 42 measures the time period T11 from when the reset signal RST changes to high level to when the output signal C_outh changes to high level based on the clock CLK, and outputs the digital signal D_out to which the information indicating that the logical level of the output signal C_outh was changed during the time period T11 is added. Also, for example, in the case where the detection signal S_out changes in dependent on the acceleration as indicated by B in FIG. 4, when the voltage level of the detection signal S_out becomes smaller than $V_{com}-\Delta Vhys$, the output signal C_outl will change to low level. In this case, the digital circuit 42 measures the time period T12 from when the reset signal RST changes to high level to when the output signal C_outl changes to low level based on the clock CLK, and outputs the digital signal D_out to which the information indicating that the logical level of the output signal C_outl was changed during the time period T12 is added.

In this way, in the acceleration detection circuit 40, the driving signals Drv_p and Drv_n to drive the resistors R11 to R14 constituting the piezo-resistor acceleration sensor are changed based on the clock CLK, the detection signal S_out resulted from the changes in the driving signals Drv_p and Drv_n is compared to the reference voltage $V_{com}$, and based on the clock CLK and the resulting output signal C_out showing the result of the comparison, the time period depending on the detection signal S_out is determined. That is, the acceleration detection circuit 40 does not require an AD converter, therefore, the effects similar to that attained in the magnetic detection circuit 10 can also be attained.

Temperature Detection Circuit

Figure 5:
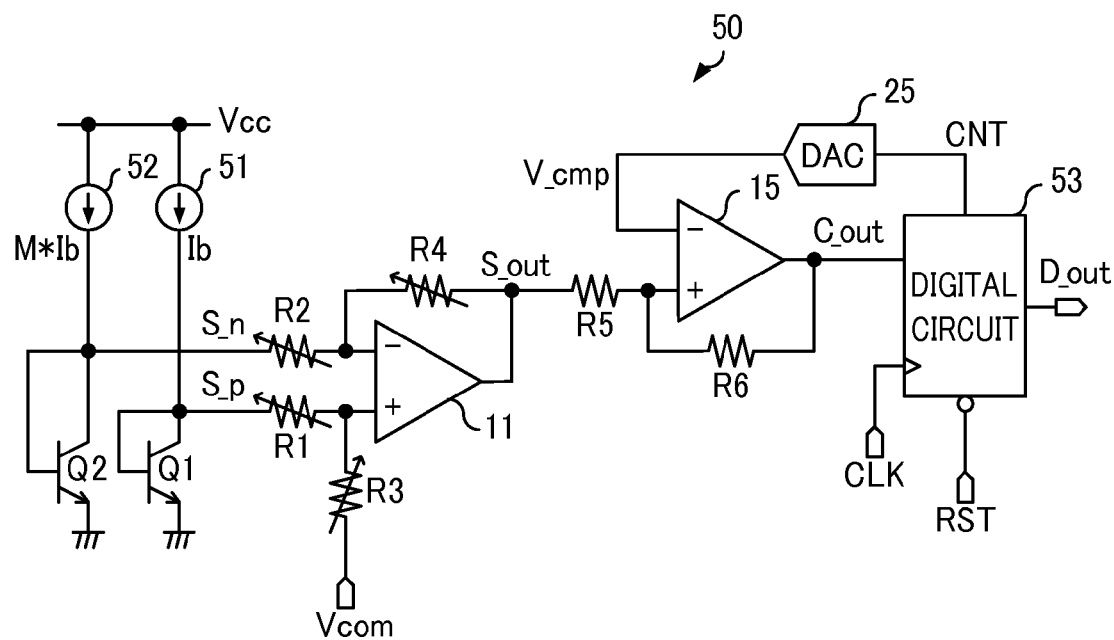
FIG. 5 is a diagram showing an example of a configuration for a temperature detection circuit in accordance with an embodiment of the present invention.

FIG. 5 is a diagram showing an example of a configuration for a temperature detection circuit in accordance with an embodiment of the present invention. The temperature detection circuit 50 includes current supplies 51 and 52, NPN transistors Q1 and Q2, and a digital circuit 53, in addition to the operational amplifier 11, the comparator 15, the resistors R1 to R6, and the DAC 25 provided in the magnetic detection circuit 10.

The current supply 51 outputs constant current Ib, and the current supply 52 outputs constant current that is M times as large as that of the current supply 51. The NPN transistors Q1 and Q2 are diode-connected and driven by the current supplies 51 and 52, respectively. The base-emitter voltages Vbe of the NPN transistors Q1 and Q2 have voltage levels which depend on temperature and the current amount from the current supplies 51 and 52. That is, the current supplies 51 and 52 and the NPN transistors Q1 and Q2 constitute a temperature sensor, and the detection signals S_p and S_n which depend on the temperature are output from collectors of the NPN transistors Q1 and Q2.

As with the digital circuit 20 in the magnetic detection circuit 10, the digital circuit 53 includes a counter, outputs a count value CNT for controlling a voltage V_cmp to be compared with the detection result S_out in the comparator 15, and also outputs a digital signal D_out indicating the detection result of temperature. Particularly, the digital circuit 53 starts counting up the count value CNT when the reset signal RST becomes high level. Also, the digital circuit 53 measures a time period from when the reset signal RST changes to high level to when the output signal C_out from the comparator 15 changes to low level and then outputs the measured time period as a digital signal D_out depending on the detection signal S_out.

Figure 6:
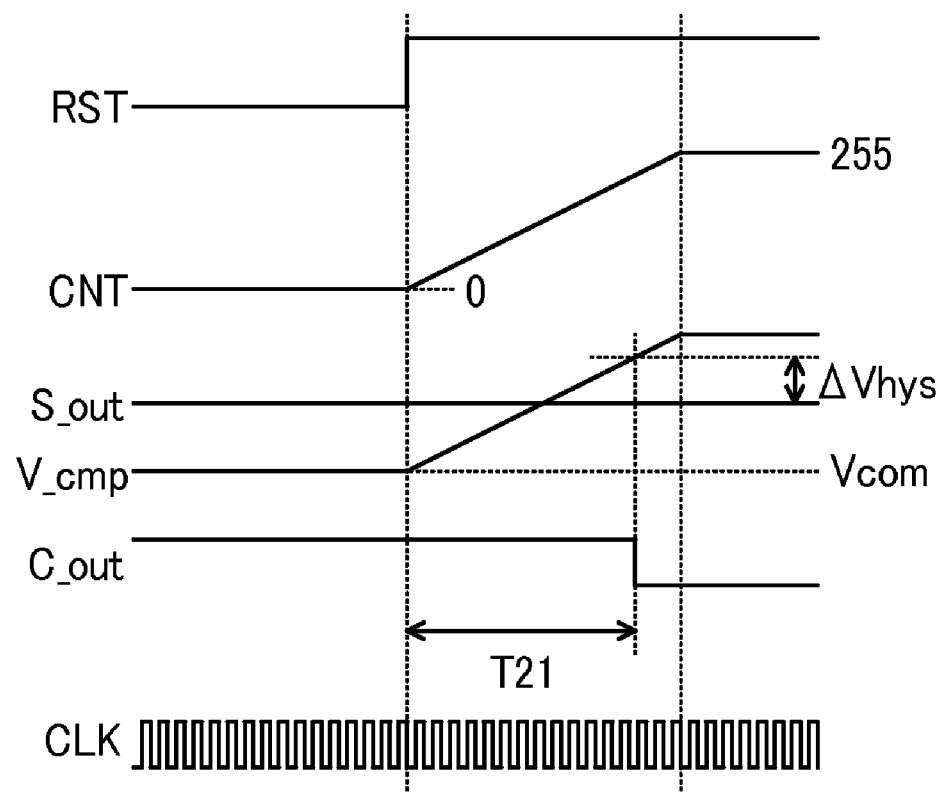
FIG. 6 is a diagram showing an example of an operation of the temperature detection circuit.

FIG. 6 is a diagram showing an example of an operation of the temperature detection circuit 50. Here, the counter which updates the count value CNT has eight bits, and the count value CNT is set to an initial value of 0.

When the reset signal RST changes to high level, the digital circuit 53 starts counting up the count value CNT from 0 based on the clock CLK. Along with the count value CNT, the voltage level of the voltage V_cmp applied to the negative input terminal of the comparator 15 increases from the reference voltage $V_{com}$.

Then, when the voltage V_cmp becomes higher than the voltage level of the detection signal S_out depending on temperature by the value of $\Delta Vhys$, the output signal C_out changes to low level. That is, a time period T21 from when the reset signal RST changes to high level to when the output signal C_out of the comparator 15 changes to low level depends on the voltage level of the detection signal S_out. Therefore, the digital circuit 53 measures the time period T21 from when the reset signal RST changes to high level to when the output signal C_out changes to low level based on the clock CLK, and outputs the measured time period T21 as the digital signal D_out indicating the detection result of temperature.

In this way, in the temperature detection circuit 50, the voltage level of the voltage V_cmp to be compared with the detection signal S_out is changed based on the clock CLK, and the time period depending on the detection signal S_out is measured based on the clock CLK and the output signal C_out indicating the comparison result of the detection signal S_out and the voltage V_cmp. That is, the temperature detection circuit 50 does not require an AD converter, therefore, the effects similar to that attained in the magnetic detection circuit 10 can also be attained.

Multi-Detection Circuit

Figure 7:
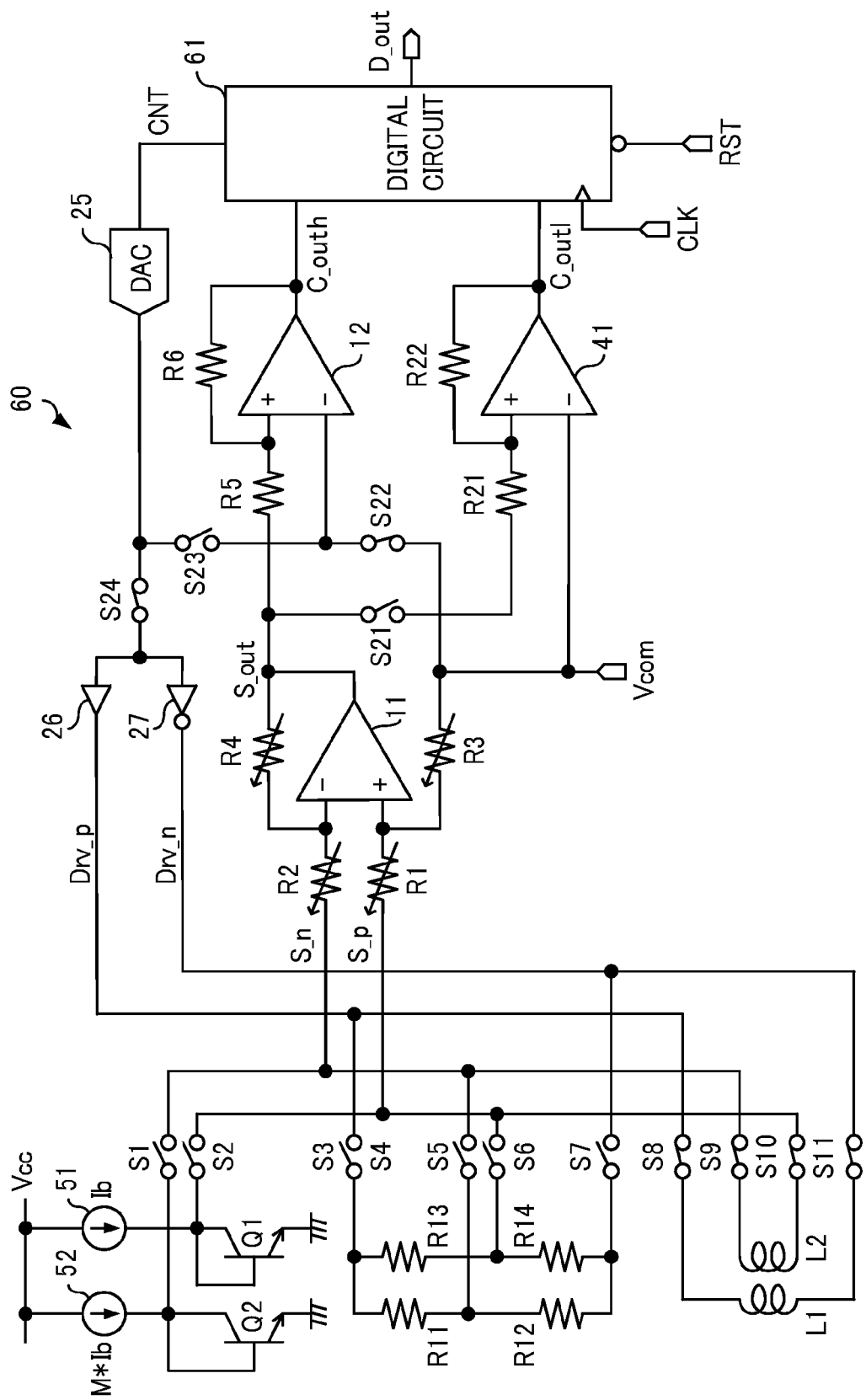
FIG. 7 is a diagram showing an example of a configuration for a multi-detection circuit in accordance with the present invention.

FIG. 7 is a diagram showing an example of a configuration for a multi-detection circuit in accordance with the present invention. The multi-detection circuit 60 includes switches S1 to S24 in addition to the components shown in the magnetic detection circuit 10, the acceleration detection circuit 40, and the temperature detection circuit 50. Also, a digital circuit 61 has functions of the digital circuits 20, 42, and 53.

The multi-detection circuit 60 can output a digital signal D_out indicating the detection result of any one of magnetic force, acceleration, and temperature by properly turning on or off the switches S1 to S24. For example, by turning on the switches S8 to S11, S22, and S24 and turning off the other switches, the digital signal D_out will indicate the detection result of magnetic force. Also, for example, by turning on the switches S3 to S7, S21, S22 and S24 and turning off the other switches, the digital signal D_out will indicate the detection result of acceleration. Also, for example, by turning on the switches S1, S2, and S23 and turning off the other switches, the digital signal D_out will indicate the detection result of temperature.

In this way, in the multi-detection circuit 60, the component circuits including the operational amplifier 11, the comparator 15, and the DAC 25 are shared by the magnetic sensor, the acceleration sensor, and the temperature sensor. That is, the detection circuit which can switch among a plurality of sensors without an AD converter can be realized with a simple configuration.

Offset Cancellation

Some of the components described above, such as the operational amplifier 11 and the comparator 15 have an offset voltage. In this case, due to the effect of the offset voltage, it may be difficult to detect a detection signal having minute level from a sensor with high accuracy. Therefore, in such a situation, cancelling the offset voltage can improve the detection accuracy.

Figure 8:
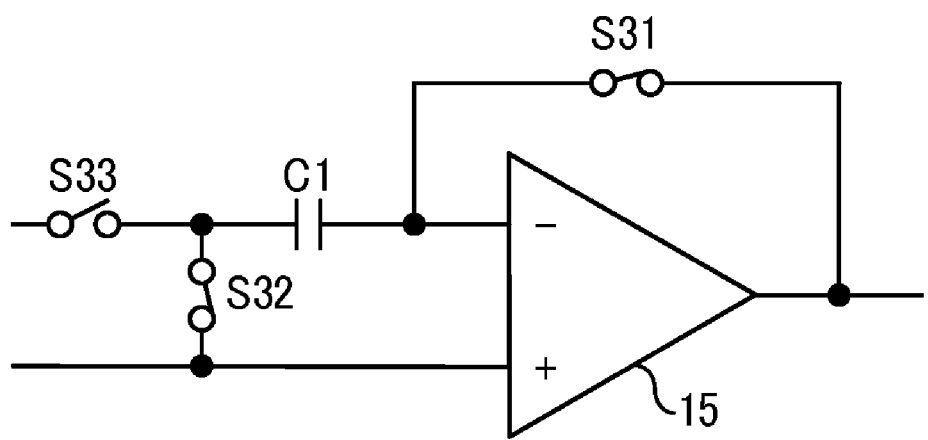
FIG. 8 is a diagram showing an example of a configuration for an offset cancellation circuit.

FIG. 8 is a diagram showing an example of a configuration for an offset cancellation circuit. As shown in FIG. 8, as a circuit for cancelling the offset voltage of the comparator 15, a capacitor C1 and switches S31 to S33 are provided. Note that the switch S31 is one example of a first switch circuit according to the present invention, and the switch S32 is one example of a second switch circuit according to the present invention.

Firstly, prior to performing a comparison operation in the comparator 15, a controller such as a microcomputer turns on the switches S31 and S32 and turns the switch S33 off. Here, assuming that the comparator 15 has an offset voltage Vos, by turning on the switches S31 and S32, and turning the switch S33 off, the offset voltage Vos is sampled into the capacitor C1. Then, when the comparator 15 performs comparison operation, by turning off the switches S31 and S32 and turning the switch S33 on by the controller such as a microcomputer, the offset voltage Vos of the comparator 15 is cancelled out by the voltage sampled into the capacitor C1. In this way, cancelling the offset voltage of the comparator 15 can improve the comparison operation accuracy in the comparator 15, making it possible to detect a detection signal having minute level from a sensor with high accuracy. Note that, while, in FIG. 8, the offset cancellation for the comparator 15 is shown, offset cancellation circuits for other components such as the operational amplifier 11 and comparator 41 can be provided to improve detection accuracy as well.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A detection circuit comprising:
   a control signal updating circuit configured to update a digital control signal for controlling drive of a sensor based on a clock having a predetermined frequency;
   a digital to analog converter configured to convert the digital control signal output from the control signal updating circuit to an analog control signal for driving the sensor;
   a comparator configured to compare a voltage level of a detection signal from the sensor which changes depending on the analog control signal with a reference voltage having a predetermined voltage level to output a comparison result signal; and
   a counter configured to count to measure a time period depending on the detection signal based on the comparison result signal output from the comparator and a clock having a predetermined frequency.

2. The detection circuit according to claim 1, further comprising:
   a first switch connected at one end to an output terminal of the comparator and connected at the other end to one of input terminals of the comparator;
   a capacitor connected at one end to the other end of the first switch; and
   a second switch connected at one end to the other end of the capacitor and connected at the other end to the other of the input terminals of the comparator, wherein
   the first and second switches are further configured to be turned on prior to a comparison operation in the comparator in order to sample an offset voltage of the comparator into the capacitor, and to be turned off during a comparison operation in the comparator in order to cancel the offset voltage of the comparator.

3. A detection circuit comprising:
   a comparator configured to compare a voltage level of a detection signal from a sensor with a reference voltage to output a comparison result signal;
   a control signal updating circuit configured to update a digital control signal for controlling a voltage level of the reference voltage based on a clock having a predetermined frequency;
   a digital to analog converter configured to generate the reference voltage having a voltage level depending on the digital control signal output from the control signal updating circuit; and
   a counter configured to count to measure a time period depending on the detection signal based on the comparison result signal output from the comparator and a clock having a predetermined frequency.

4. The detection circuit according to claim 3, further comprising:
   a first switch connected at one end to an output terminal of the comparator and connected at the other end to one of input terminals of the comparator;
   a capacitor connected at one end to the other end of the first switch; and
   a second switch connected at one end to the other end of the capacitor and connected at the other end to the other of the input terminals of the comparator, wherein
   the first and second switches are further configured to be turned on prior to a comparison operation in the comparator in order to sample an offset voltage of the comparator into the capacitor, and to be turned off during a comparison operation in the comparator in order to cancel the offset voltage of the comparator.

5. A detection circuit comprising:
   a control signal updating circuit configured to update a digital control signal based on a clock having a predetermined frequency;
   a digital to analog converter configured to convert the digital control signal output from the control signal updating circuit to an analog control signal;
   a driving circuit configured to output a driving signal for driving a first or second sensor based on the analog control signal output from the digital to analog converter;
   a first selector configured to output the driving signal output from the driving circuit to either of the first or second sensor;
   a second selector configured to output a detection signal output from either of the first or second sensor;
   a comparator configured to compare the detection signal output from the second selector with a reference voltage having a predetermined voltage level to output a comparison result signal; and
   a counter configured to count to measure a time period depending on the detection signal based on the comparison result signal output from the comparator and a clock having a predetermined frequency.

6. The detection circuit according to claim 5, further comprising:

a third selector configured to output the reference voltage having the predetermined voltage level when outputting a detection result from the first or second sensor, and to output the reference voltage having a voltage level depending on the analog control signal output from the digital to analog converter when outputting a detection result from a third sensor configured to operate irrespective of the digital control signal, wherein the second selector is further configured to output a detection signal output from either one of the first, second, or third sensor, and the comparator is further configured to compare the detection signal output from the second selector with the reference voltage output from the third selector to output the comparison result signal.

7. The detection circuit according to claim 6, further comprising:

a first switch connected at one end to an output terminal of the comparator and connected at the other end to one of input terminals of the comparator;

a capacitor connected at one end to the other end of the first switch; and a second switch connected at one end to the other end of the capacitor and connected at the other end to the other of the input terminals of the comparator, wherein the first and second switches are further configured to be turned on prior to a comparison operation in the comparator in order to sample an offset voltage of the comparator into the capacitor, and to be turned off during a comparison operation in the comparator in order to cancel the offset voltage of the comparator.

8. The detection circuit according to claim 5, further comprising:

a first switch connected at one end to an output terminal of the comparator and connected at the other end to one of input terminals of the comparator;

a capacitor connected at one end to the other end of the first switch; and a second switch connected at one end to the other end of the capacitor and connected at the other end to the other of the input terminals of the comparator, wherein the first and second switches are further configured to be turned on prior to a comparison operation in the comparator in order to sample an offset voltage of the comparator into the capacitor, and to be turned off during a comparison operation in the comparator in order to cancel the offset voltage of the comparator.

* * * * *